United States Patent
Ashizawa

(10) Patent No.: US 8,520,329 B2
(45) Date of Patent: Aug. 27, 2013

(54) PIEZOELECTRIC ACTUATOR, LENS BARREL AND OPTICAL DEVICE

(75) Inventor: Takatoshi Ashizawa, Yokohama (JP)

(73) Assignee: Nikon Corporation, Tokyo (JP)

( * ) Notice: Subject to any disclaimer, the term of this patent is extended or adjusted under 35 U.S.C. 154(b) by 136 days.

(21) Appl. No.: 12/997,670

(22) PCT Filed: Jun. 10, 2009

(86) PCT No.: PCT/JP2009/060628
§ 371 (c)(1),
(2), (4) Date: Dec. 13, 2010

(87) PCT Pub. No.: WO2009/151081
PCT Pub. Date: Dec. 17, 2009

(65) Prior Publication Data
US 2011/0096423 A1 Apr. 28, 2011

(30) Foreign Application Priority Data
Jun. 12, 2008 (JP) .................................. 2008-154430

(51) Int. Cl.
*G02B 7/02* (2006.01)
(52) U.S. Cl.
USPC .......................................... 359/824; 359/822
(58) Field of Classification Search
USPC 359/694–704, 811–824; 310/323.01–323.16
See application file for complete search history.

(56) References Cited

U.S. PATENT DOCUMENTS

| 2003/0067544 A1 | 4/2003 | Wada |
| 2007/0035205 A1* | 2/2007 | Shirie ........................ 310/323.01 |
| 2009/0001852 A1* | 1/2009 | Ashizawa ................. 310/323.16 |

FOREIGN PATENT DOCUMENTS

| JP | A 55-100059 | 7/1980 |
| JP | A 61-182112 | 8/1986 |
| JP | A 4-000281 | 1/1992 |
| JP | A 2003-110919 | 4/2003 |
| JP | A 2005-312192 | 11/2005 |

OTHER PUBLICATIONS

International Search Report issued in PCT/JP2009/060628, mailed Aug. 25, 2009.
Oct. 23, 2012 Office Action issued in JP Application No. 2008-154430 (with English translation).

* cited by examiner

*Primary Examiner* — Mohammed Hasan
(74) *Attorney, Agent, or Firm* — Oliff & Berridge, PLC

(57) ABSTRACT

A piezoelectric actuator having reduced sizes, a lens barrel and an optical device. A piezoelectric actuator is provided with: a first actuator including first piezoelectric elements to be displaced in a first direction; a second actuator, which includes second piezoelectric elements to be displaced in a second direction intersecting with the first direction, and is arranged in a direction intersecting with the first direction with respect to the first actuator; and a relative displacement member, which is arranged between the first actuator and the second actuator and can be relatively displaced in the first direction with respect to the first actuator.

12 Claims, 9 Drawing Sheets

PIEZOELECTRIC ACTUATOR, LENS BARREL AND OPTICAL DEVICE

TECHNICAL FIELD

The present invention relates to a piezoelectric actuator, a lens barrel, and an optical device.

BACKGROUND ART

A linear type piezoelectric actuator utilizing a progressive vibration wave that performs a peristalsis type motion by combining two pressurizing piezoelectric elements and one expanding and contracting piezoelectric element is known (for example, refer to Patent Document 1).

Patent Document 1: Japanese Unexamined Patent Application, Publication No. S55-100059

DISCLOSURE OF THE INVENTION

Problems to be Solved by the Invention

However, the piezoelectric actuator of the above Patent Document has a complicated structure, and therefore, miniaturization of the piezoelectric actuator is difficult.

An object of the present invention is to provide a piezoelectric actuator, a lens barrel, and an optical device that can be miniaturized.

Means for Solving the Problems

According to the present invention, the above-mentioned object is achieved by the following solutions.

An invention described in Claim 1 is a piezoelectric actuator comprising: a first actuator including a first piezoelectric element to be displaced in a first direction; a second actuator, which includes a second piezoelectric element to be displaced in a second direction intersecting with the first direction, and is arranged in a direction intersecting with the first direction with respect to the first actuator; and a relative motion member, which is arranged between the first actuator and the second actuator and can be relatively moved in the first direction with respect to the first actuator; and wherein the second actuator can be switched to a pressurized state where the relative motion member and the first actuator are pressurizedly in contact with each other by displacement of the second piezoelectric element, and a non-pressurized state where the pressurization is removed, and the relative motion member is relatively moved in the first direction by displacement of the first piezoelectric element during the pressurized state.

An invention described in Claim 2 is the piezoelectric actuator according to Claim 1, wherein the second actuator is set to the non-pressurized state after the displacement of the first piezoelectric element, and the first piezoelectric element is displaced in a direction opposite to the time of the relative motion when the second actuator is in the non-pressurized state.

An invention described in Claim 3 is the piezoelectric actuator according to Claim 1 or 2, wherein the first actuator includes a first contact portion, which is in contact with the relative motion member when in the pressurized state, and is moved in the first direction in conjunction with the displacement of the first piezoelectric element, and the relative motion member performs the relative motion by a frictional force produced between the first contact portion.

An invention described in Claim 4 is the piezoelectric actuator according to Claim 3, wherein the second actuator includes a second contact portion, which is in contact with the relative motion member when in both the pressurized state and the non-pressurized state, and frictional force produced between the first contact portion and the relative motion member is larger than frictional force produced between the second contact portion and the relative motion member when in the pressurized state, and is smaller than frictional force produced between the second contact portion and the relative motion member when in the non-pressurized state.

An invention described in Claim 5 is the piezoelectric actuator according to any one of Claims 1 to 3, wherein the first actuator includes a third piezoelectric element to be displaced in the second direction, and is configured to be able to transfer between a pressurized state where the relative motion member and the second actuator are pressurizedly in contact with each other, and a non-pressurized state where the pressurization is removed, in accordance with a displacement of the third piezoelectric element, the second actuator includes a fourth piezoelectric element to be displaced in the first direction, and the relative motion member is relatively moved in the first direction with respect to the first actuator and the second actuator by displacements of the first piezoelectric element and the fourth piezoelectric element when both the first actuator and the second actuator are in the pressurized state.

An invention described in Claim 6 is the piezoelectric actuator according to Claim 5, wherein both the first actuator and the second actuator are set into the non-pressurized state after the displacement of the first piezoelectric element, and the first piezoelectric element and the fourth piezoelectric element are displaced in a direction opposite to the time of the relative motion when both the first actuator and the second actuator are in the non-pressurized state.

An invention described in Claim 7 is the piezoelectric actuator according to Claim 5 or 6, wherein the first piezoelectric element and the third piezoelectric element, as well as the second piezoelectric element and the fourth piezoelectric element are respectively laminated in the second direction.

An invention described in Claim 8 is the piezoelectric actuator according to any one of Claims 1 to 7, further comprising a through hole defining portion for defining a through hole that penetrates in the first direction, wherein the relative motion member is arranged to pass through the through hole, and a friction member for suppressing the relative motion of the relative motion member caused by its own weight by means of a frictional force produced when the relative motion member is arranged in the through hole defining portion.

An invention described in Claim 9 is the piezoelectric actuator according to any one of Claims 1 to 7, further comprising a retention mechanism for holding the relative motion member when the second actuator is in the non-pressurized state, and suppressing the relative motion of the relative motion member caused by its own weight by means of a frictional force produced between the retention mechanism and the relative motion member.

An invention described in Claim 10 is a lens barrel comprising: the piezoelectric actuator according to any one of Claims 1 to 9; and a lens included in the piezoelectric actuator and moves in conjunction with the relative motion member.

An invention described in Claim 11 is an optical device comprising the piezoelectric actuator according to any one of Claims 1 to 9.

It is noted that the arrangement of the above may be improved suitably and may substitute at least a part thereof with other structures.

Effects of the Invention

In accordance with the present invention, it is possible to provide a piezoelectric actuator, a lens barrel, and an optical device that can be miniaturized.

Figure 1:
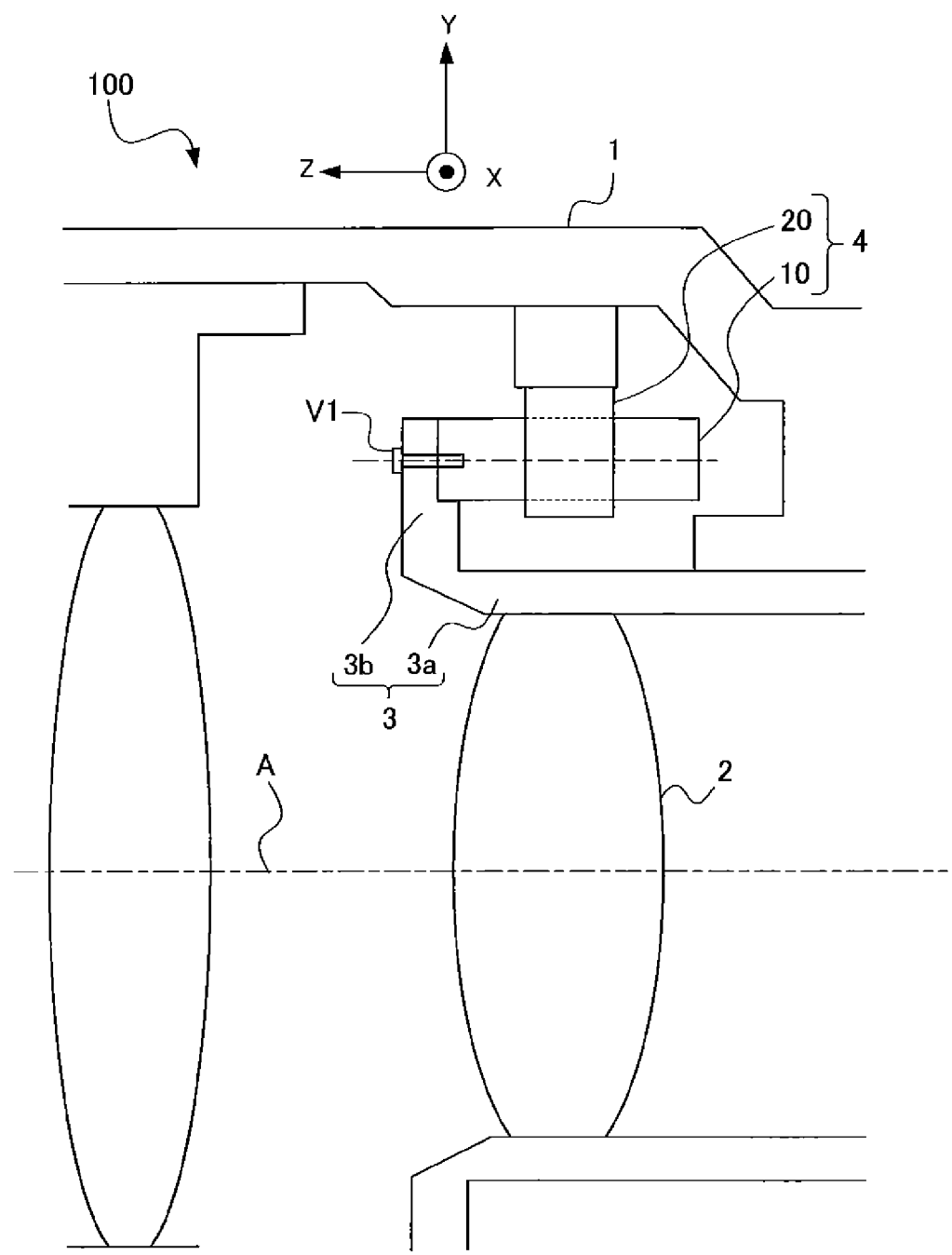
FIG. 1 shows a cross-sectional view of a principal part of a lens barrel according to a first embodiment.

EXPLANATION OF REFERENCE NUMERALS 4 piezoelectric actuator
10 output member
30 pressurizing actuator
31, 32 pressurizing piezoelectric element
40 driving actuator
41, 42 driving piezoelectric element
100 lens barrel

PREFERRED MODE FOR CARRYING OUT THE INVENTION

First Embodiment

Hereafter, embodiments of the lens barrel including the piezoelectric actuator in accordance with the present invention will be described with reference to the drawings.

FIG. 1 shows a cross-sectional view of a principal part of a lens barrel according to a first embodiment.

Hereafter, a three-dimensional coordinate system formed with X-Y-Z axis is set in each of the drawings including FIG. 1 to provide easy understanding.

A lens barrel 100 is an interchangeable lens barrel installed onto a camera body (not illustrated) attachably and detachably, and is provided with a fixed tube 1, a focus lens unit 2, a focusing unit holding frame 3, and a piezoelectric actuator 4 and others.

The fixed tube 1 is formed in cylindrical shape, and a plurality of imaging lenses including the focus lens unit 2 are housed in the bore side. An optical axis A of the imaging lens is in parallel with Z-axis of a coordinate system shown in FIG. 1. Position of the fixed tube 1 with respect to the camera body is restricted in a situation where the lens barrel 100 is connected to the camera body through a mount mechanism (not illustrated).

The focus lens unit 2 performs a forward and backward motion with respect to the fixed tube 1 in the optical axis direction according to a manual input from the user and others, or a signal from an auto-focus controller (not illustrated), which is included in the camera body. By means of a forward and backward motion of the focus lens unit 2, for example, the lens barrel 100 performs focusing onto a main photographic subject or others.

The focusing unit holding frame 3 is a frame body holding the focus lens unit 2, and is provided with a main body 3a formed cylindrical and a projecting portion 3b arranged to project from a part of peripheral surface of the main body 3a to outer diameter side.

The piezoelectric actuator 4 is a driving device which drives the focus lens unit 2 with respect to the fixed tube 1 in the optical axis direction, and is provided with an output member 10 and a driving portion 20.

Figure 2A:
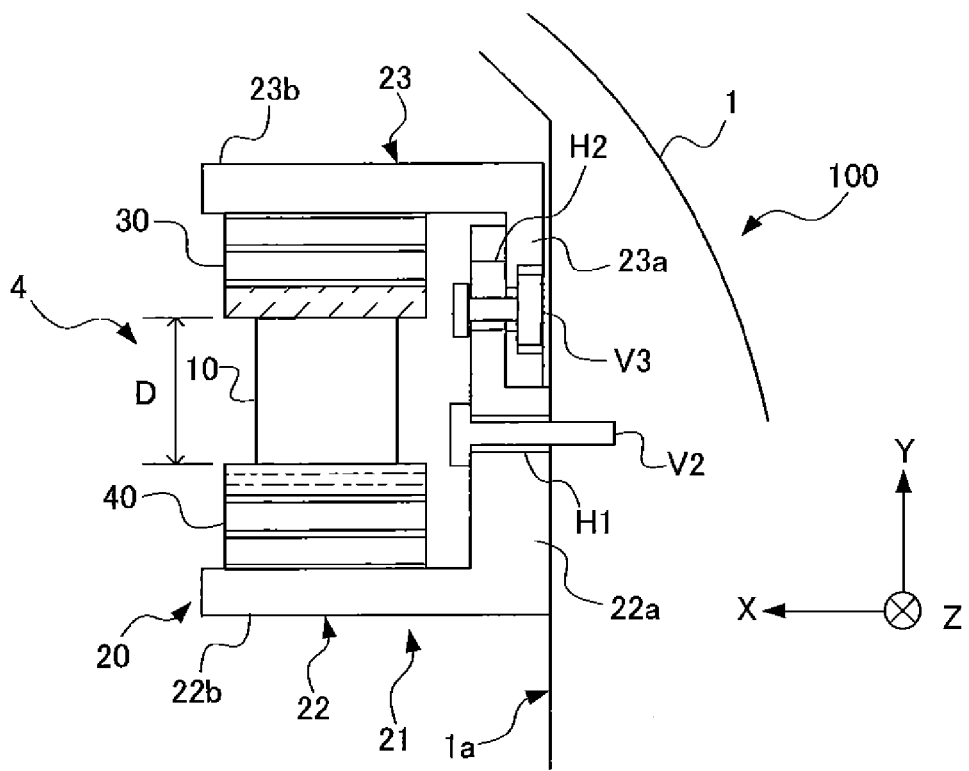
FIGS. 2A and 2B show diagrams illustrating a piezoelectric actuator provided in the lens barrel shown in FIG. 1.
Figure 2B:
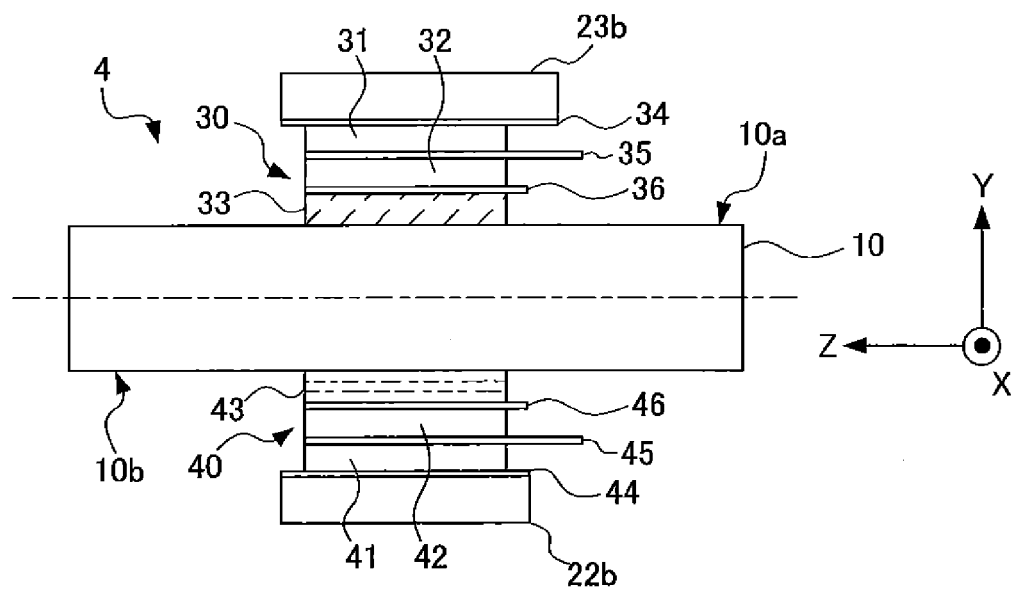

FIGS. 2A and 2B shows a diagram illustrating a piezoelectric actuator included in the lens barrel shown in FIG. 1.

FIG. 2A shows a cross-sectional view of the piezoelectric actuator from Z axis direction (optical axis direction), and FIG. 2B shows a cross-sectional view of the piezoelectric actuator from X axis direction (direction intersecting perpendicularly with the optical axis A).

Figure 3A:
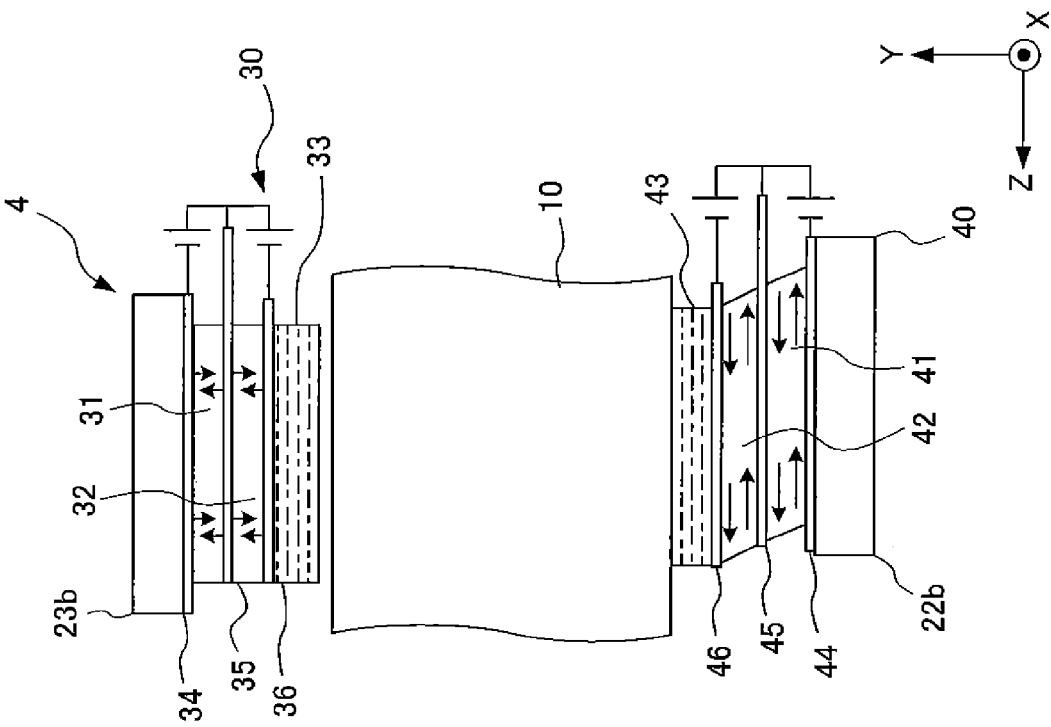
FIGS. 3A and 3B show diagrams illustrating an operation of the piezoelectric actuator shown in FIGS. 2A and 2B.
Figure 3B:
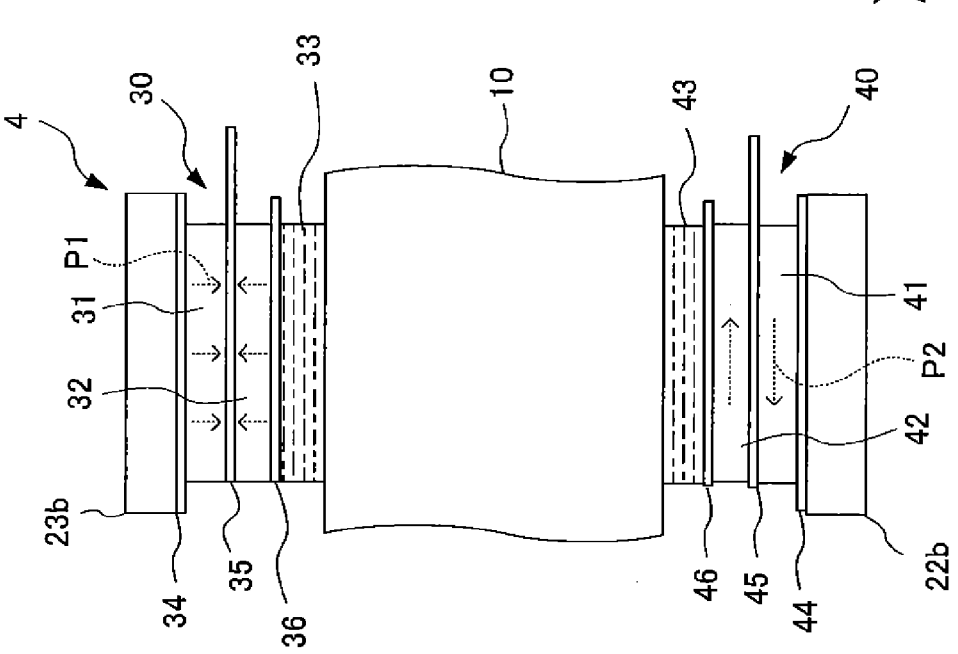
Figure 4A:
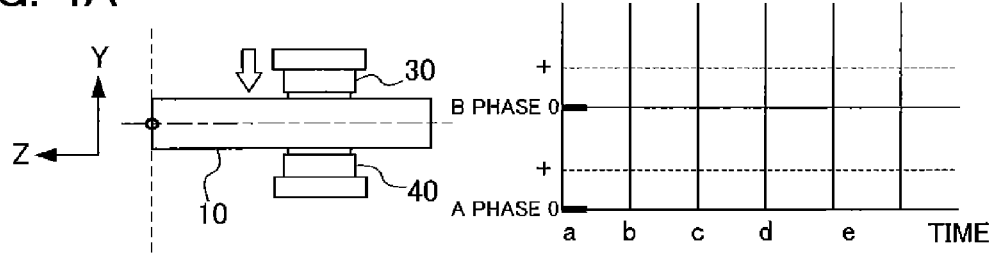
FIGS. 4A, 4B, 4C, 4D and 4E show diagrams illustrating an operation of the piezoelectric actuator shown in FIGS. 2A and 2B.
Figure 4B:
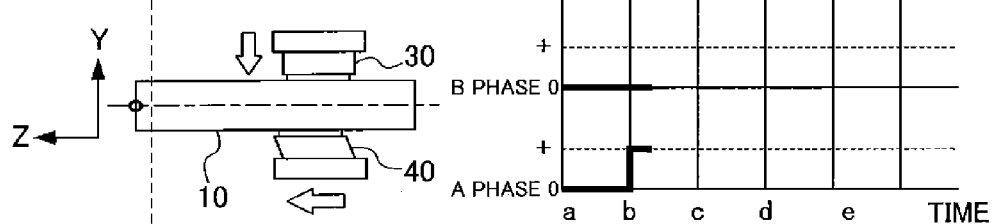
Figure 4C:
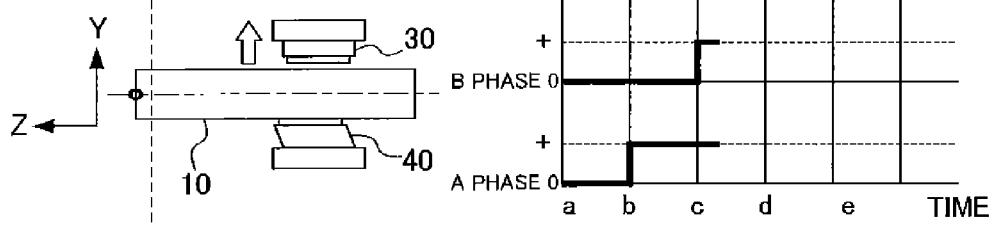
Figure 4D:
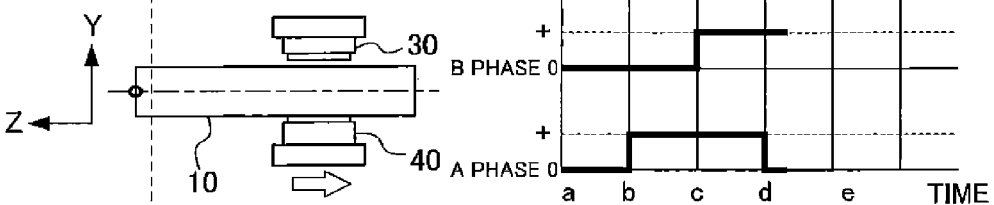
Figure 4E:
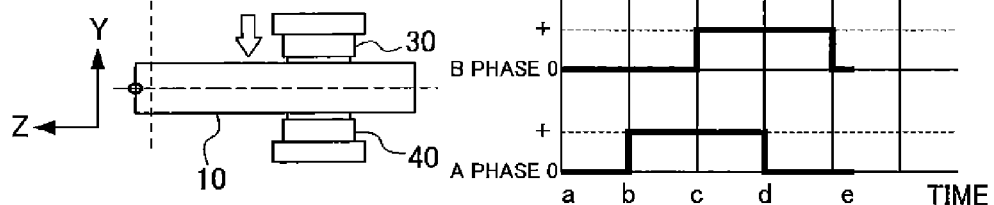

FIGS. 3A and 3B shows a diagram illustrating an operation of the piezoelectric actuator shown in FIG. 2, and FIGS. 3A and 3B show situations before and after the displacement, respectively.

The output member 10 is a rectangular column member fixed with a screw V1 (refer to FIG. 1) to a mounting side (camera body side) surface portion of the projecting portion 3b provided in the focusing unit holding frame 3, and is formed of stainless steel. The output member 10 and the focus lens unit 2 move integrally with respect to the fixed tube 1.

The output member 10 extends in parallel to optical axis A, and a cross-sectional shape of the output member 10 intersecting perpendicularly with the optical axis A is substantially quadrate-shaped. Two side surface portions among four surface portions (hereinafter referred to as "side surface portion") in the output member 10 parallel to optical axis A are substantially parallel to X-Z plane, and other two side surface portions are substantially parallel to Y-Z plane (refer to FIG. 2). In the following description, X axis direction and Y axis direction are referred to as "horizontal direction" and "vertical direction", respectively, and two side surface portions of the output member 10 intersecting perpendicularly with Y axis are referred to as "top surface portion 10a" and "bottom surface portion 10b", respectively.

The driving portion 20 is a portion that drives the output member 10 with respect to the fixed tube 1.

As shown in FIG. 2A, the driving portion 20 of the piezoelectric actuator 4 is provided with a supporting portion 21, a pressurizing actuator 30, and a driving actuator 40 and others. The pressurizing actuator 30 and the driving actuator 40 are arranged in Y axis (up and down) direction, and the output member 10 is arranged to run through between the pressurizing actuator 30 and the driving actuators 40.

The pressurizing actuator 30 is arranged to face the top surface portion 10a of the output member 10, and the driving actuator 40 is arranged to face the bottom surface portion 10b of the output member 10.

The supporting portion 21 is a portion that supports the pressurizing actuator 30 and the driving actuator 40, and is fixed to the fixed tube 1. As a result, the pressurizing actuator 30 and the driving actuator 40 are fixed to the fixed tube 1.

The supporting portion 21 is provided with a fixing portion 22 which is a portion that supports the driving actuator 40, and an adjusting portion 23 which is a portion that supports the pressurizing actuator 30.

As shown in FIG. 2A, the fixing portion 22 is a plate-like member which includes an installing surface portion 22a facing an installing surface portion 1a formed on the fixed tube 1, and a supporting surface portion 22b intersecting perpendicularly with the installing surface portion 22a. Cross-sectional shape of the fixing portion 22 intersecting perpendicularly with the optical axis A is substantially L-shaped. The fixing portion 22 is provided with a through hole H1 at the installing surface portion 22a, and is fixed to the fixed tube 1 with a plurality of screws V2 (for example, about 2 to 4 screws) that penetrate the through hole H1 (it is noted that only one screw V2 is illustrated in FIG. 2).

The adjusting portion 23 is a plate-like member that has L-shaped cross-section, including an installing surface portion 23a facing the installing surface portion 1a of the fixed tube 1, and a supporting surface portion 23b intersecting perpendicularly with the installing surface portion 23a. The adjusting portion 23 is fixed to the fixing portion 22 with a screw V3. A through hole H2 through which the screw V3 penetrates at the installing surface portion 22a is formed in the fixing portion 22. The through hole H2 is a long hole parallel to Y axis, and the installing position of the adjusting portion 23 with respect to the fixing portion 22 can be adjusted in Y axis direction. Accordingly, the supporting portion 21 can finely adjust the distance between the pressurizing actuator 30 and the driving actuator 40 (a symbol D is assigned for the distance in FIG. 2A).

The pressurizing actuator 30 presses the output member 10 toward the driving actuator 40, and is provided with a set of piezoelectric elements 31 and 32 and a slide member 33 as shown in FIG. 2B.

The set of piezoelectric elements 31 and 32 and the slide member 33 are formed plate-like square or rectangle when seen in front view, respectively. A silver electrode (not illustrated) is provided at both sides of the piezoelectric elements 31 and 32. The piezoelectric element 31 is arranged to face the supporting surface portion 23b of the adjusting portion 23 via an electrode plate 34. The slide member 33 is arranged to face a top surface portion 10a of the output member 10. The piezoelectric element 32 is arranged between the first piezoelectric element 31 and the slide member 33.

Electrode plates 35 and 36 are also arranged between the set of piezoelectric elements 31 and 32, and between the other piezoelectric element 32 and the slide member 33, respectively. Both the electrode plate 34 and the electrode plate 36 are GND electrodes that are grounded. The electrode plate 35 is a driving electrode where a driving signal which is direct current voltage is applied from B phase of a driving circuit (not illustrated).

As shown with arrows P1 in FIG. 3A, the piezoelectric elements 31 and 32 are PZT (lead zirconate titanate) piezoelectric body polarized in a direction parallel to Y axis (direction intersecting perpendicularly with the optical axis A). A polarization direction of the piezoelectric element 31 and a polarization direction of the piezoelectric element 32 are opposite with each other. As shown in FIGS. 3A and 3B, when a driving signal (B phase driving signal) is applied to the electrode plate 35, the set of piezoelectric elements 31 and 32 change their dimensions in a direction to which the signal is applied (Y axis direction) because of a piezoelectric effect of d33.

As a result of the dimension of the set of piezoelectric elements 31 and 32 changing in the Y axis direction, the pressurizing actuator 30 transfers between a pressurized state (refer to FIG. 3A) where the slide member 33 pressurizes the output member 10, and a non-pressurized state (refer to FIG. 3B) where the pressurization is removed by the slide member 33 spacing apart from the output member 10. The pressurizing actuator 30 of present embodiment is in its pressurized state at all times except when driving the focus lens unit 2.

The driving actuator 40 drives the output member 10 in the optical axis direction (Z axis direction), and is provided with a set of piezoelectric elements 41 and 42 and a friction member 43.

Each of the set of piezoelectric elements 41 and 42 and the friction member 43 are formed plate-like square or rectangle when seen in front view. A silver electrode (not illustrated) is provided at both sides of the piezoelectric elements 41 and 42. The piezoelectric element 41 is arranged to face the supporting surface portion 22b of the fixing portion 22 via the electrode plate 44. The friction member 43 is arranged to face the bottom surface portion 10b of the output member 10. The piezoelectric element 42 is arranged between the first piezoelectric element 41 and the friction member 43.

Electrode plates 45 and 46 are arranged also in spaces between the set of piezoelectric elements 41 and 42, and between the other piezoelectric element 42 and the friction member 43. Both the electrode plate 44 and the electrode plate 46 are GND electrodes, which are grounded. The electrode plate 45 is a driving electrode where a driving signal which is direct current voltage is applied from A phase of a driving circuit (not illustrated).

As shown with arrows P2 in FIG. 2A, the piezoelectric elements 41 and 42 are PZT piezoelectric bodies which is polarized in a direction parallel to Z axis (direction parallel to optical axis A). The polarization direction of the first piezoelectric element 41 and the polarization direction of the other piezoelectric element 42 are in opposite direction with each other. As shown in FIG. 3B, each one of the set of piezoelectric elements 41 and 42 is displaced in a direction (Z axis direction) intersecting perpendicularly with the direction to which the driving signal is applied because of the piezoelectric effect of d15 when a driving signal (A phase driving signal) is applied to the electrode plate 45.

With regards to the driving actuator 40, the friction member 43 moves in Z axis direction by the set of piezoelectric elements 41 and 42 displacing in Z axis direction, and the output member 10 moves in Z axis direction because of a frictional force.

Now, the frictional force between the output member 10 and the slide member 33 and the frictional force between the output member 10 and the friction member 43 will be described.

The slide member 33 is formed of PTFE (polytetrafluoroethylene) containing polyoxymethylene, for example, and the friction member 43 is formed of GF (glass fiber) containing polycarbonate, for example.

The coefficient of friction (coefficient of static friction) is set so that the frictional force produced between the output member 10 and the friction member 43 upon driving the output member 10 becomes larger than the frictional force produced between the output member 10 and the slide member 33. Specifically, the coefficient of friction between the output member 10 and the friction member 43 is preferably 0.5 or more, for example, and the coefficient of friction between the output member 10 and the slide member 33 is preferably 0.3 or less, for example.

Next, the operation when the driving portion 20 included in the piezoelectric actuator 4 drives the output member 10 will be described. An operation when the output member 10 is driven in +Z direction will be described herein as an example.

FIG. 4 shows a diagram illustrating an operation of the piezoelectric actuator shown in FIG. 2.

<State (a): Initial State>

This is an initial state where the A phase driving signal is at a low level voltage value L (0V) and the B phase driving signal is at a low level voltage value L (0V).

The driving actuator 40 is in a state where there is no displacement in Z axis direction. The pressurizing actuator 30 is in a state where the output member 10 is pressurized onto the driving actuator 40. Therefore, the output member 10 is in a state where it is substantially fixed with respect to the driving portion 20. At the piezoelectric actuator 4, the state shown in FIG. 4A continues from time a until time b.

At the piezoelectric actuator 4, the distance (symbol D in FIG. 2A) between the pressurizing actuator 30 and the driving actuator 40 is smaller than the size of the output member 10 in Y axis direction in advance so that the pressurizing actuator 30 can pressurize the output member 10 at the initial state. When passing through the output member 10 between the pressurizing actuator 30 and the driving actuator 40 at the time of assembly of the piezoelectric actuator 4, the B phase driving signal is applied to the pressurizing actuator 30 to shorten the size in X axis direction. At this situation, the output member 10 is inserted between the pressurizing actuator 30 and the driving actuator 40.

<State (b): Driving Actuator Displacement>

This is a state where the A phase driving signal is at a high level voltage value H (predetermined positive voltage value) and the B phase driving signal is at a low level voltage value L (0V).

If the A phase driving signal is applied at a state where the pressurizing actuator 30 is pressurizing the output member 10 toward the driving actuator 40, each of the piezoelectric elements 41 and 42 is displaced in +Z direction in the driving actuator 40.

As described above, the frictional force between the friction member 43 and the output member 10 is larger than the frictional force between the slide member 33 and the output member 10, when the friction member 43 moves in Z axis direction in accordance with the displacement of the piezoelectric elements 41 and 42 in Z axis direction, the output member 10 moves rectilinearly in +Z direction, while sliding on the slide member 33. Thereby, the focus lens unit 2 moves rectilinearly in the optical axis direction. At the piezoelectric actuator 4, the state shown in FIG. 4 (b) continues from time b until time c.

<State (c): Pressurizing Actuator Displacement>

This is a state where the A phase driving signal is at a high level voltage value H (predetermined positive voltage value) and the B phase driving signal is at a high level voltage value H (predetermined positive voltage value).

The B phase driving signal is inputted into the pressurizing actuator 30 in a state where the driving actuator 40 remains at a displaced position. Consequently, each of the piezoelectric elements 31 and 32 of the pressurizing actuator 30 is displaced. Then, according to the displacement of the piezoelectric elements 31 and 32, the slide member 33 moves away from the output member 10 to remove the pressurization toward the output member 10 by the pressurizing actuator 30. At the piezoelectric actuator 4, the state shown in FIG. 4 (c) continues from time c until time d.

<State (d): Driving Actuator Restitution>

This is a state where the A phase driving signal is at a low level voltage value L (0V) and the B phase driving signal is at a high level voltage value H (predetermined positive voltage value).

If the A phase driving signal is removed at a state where the pressurization toward the output member 10 is removed, each of the piezoelectric elements 41 and 42 of the driving actuator 40 returns to the position at state (a).

At this time, the friction member 43 and the output member 10 are in contact with each other but the pressure caused by the pressurizing actuator 30 is not working. Therefore, the frictional force produced between the friction member 43 and the output member 10 becomes small enough to practically ignore the frictional force. Thus, even if the piezoelectric elements 41 and 42 of the driving actuator 40 are displaced, the output member 10 does not move in Z axis direction. At the piezoelectric actuator 4, the state shown in FIG. 4 (d) continues from time d until time e.

<State (e): Initial State>

This is an initial state where the A phase driving signal is at a low level voltage value L (0V) and the B phase driving signal is at a low level voltage value L (0V) as in state (a). The piezoelectric actuator 4 has an operational cycle that starts from the initial state (a) and ends when returning to the initial state (e). The periodicity of the single operational cycle is set to an ultrasonic range of 20 kHz or more, for example. Thereby, the piezoelectric actuator 4 drives the output member 10, that is, the focus lens unit 2, at high speed in the optical axis direction. Moreover, since the piezoelectric elements 31, 32, 41, and 42 are displaced at operational cycles in ultrasonic range, it is possible to achieve excellent quietness.

When driving the output member 10 in a direction (−Z direction) opposite to the case shown in FIG. 4, the piezoelectric actuator 4 may be driven in an order (order of (e), (d), (c), (b) and (a)) opposite to the above-described cycle (order of (a), (b), (c), (d) and (e)).

That is, from the initial state (state (e)), first, the press by the pressurizing actuator 30 is removed (state (d)), and under this situation, the driving actuator 40 is displaced (state (c)) (the output member 10 does not move).

Thereafter, the output member 10 is pressed by the pressurizing actuator 30 (state (b)), and the driving actuator 40 returns to the initial position (state (a)).

According to the above-described piezoelectric actuator 4 of the first embodiment, it is possible to achieve the following advantageous effects.

(1) The piezoelectric actuator 4 has a simple structure that drives the output member 10 with two actuators, that is, the driving actuator 40 which drives the output member 10, and the pressurizing actuator 30 which pressurizes the output member 10 toward the driving actuator 40, and therefore it is possible to achieve miniaturization.

(2) The friction member 43 is in contact with the output member 10 at all times, and therefore, even if the slide member 33 moves apart from the output member 10, it is possible to suppress the posture of the output member 10 becoming unstable.

(3) The lens barrel 100 drives the focus lens unit 2 directly by the piezoelectric actuator 4, and therefore, it is possible to reduce conversion loss and to improve energy efficiency compared with, for example, the case where the drive is done by a rotation-rectilinear motion transformation mechanism, such as a cam mechanism and a helicoid mechanism.

Second Embodiment

Next, a second embodiment of the piezoelectric actuator in accordance with the present invention will be described. In the second embodiment and other embodiments that will be described later, identical numerals or numerals that have the same end are assigned to portions that have similar functions to the above-described first embodiment in order to suitably omit duplicative explanations and drawings.

Figure 5A:
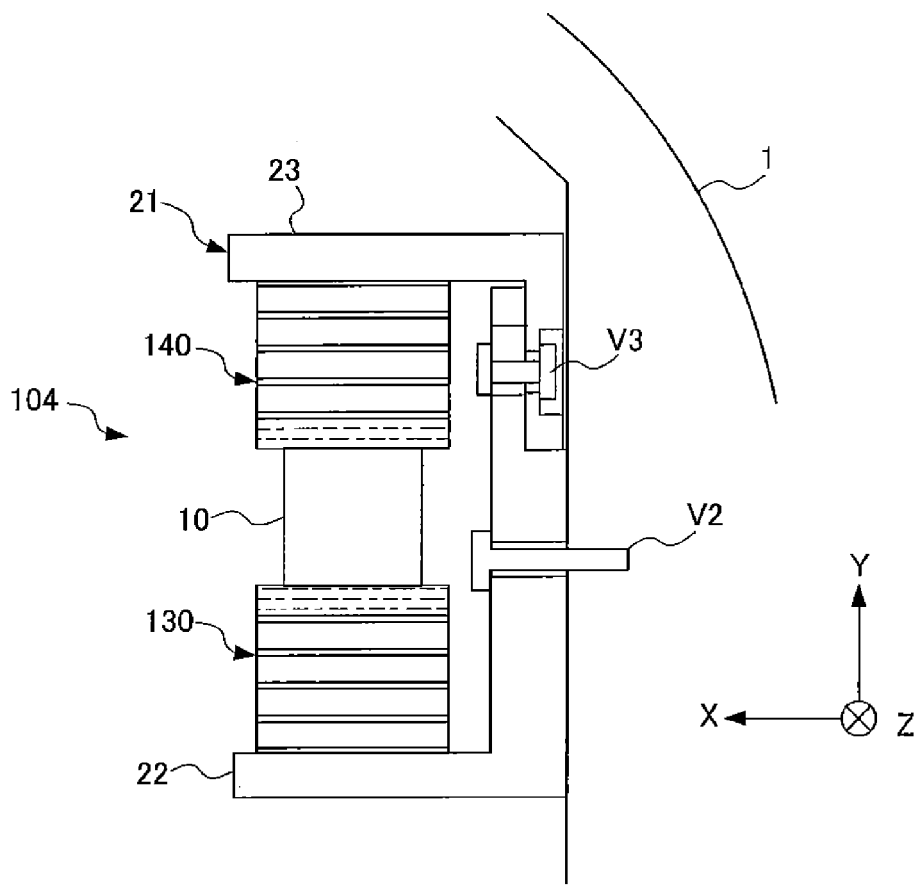
FIGS. 5A and 5B show diagrams illustrating a piezoelectric actuator according to a second embodiment.
Figure 5B:
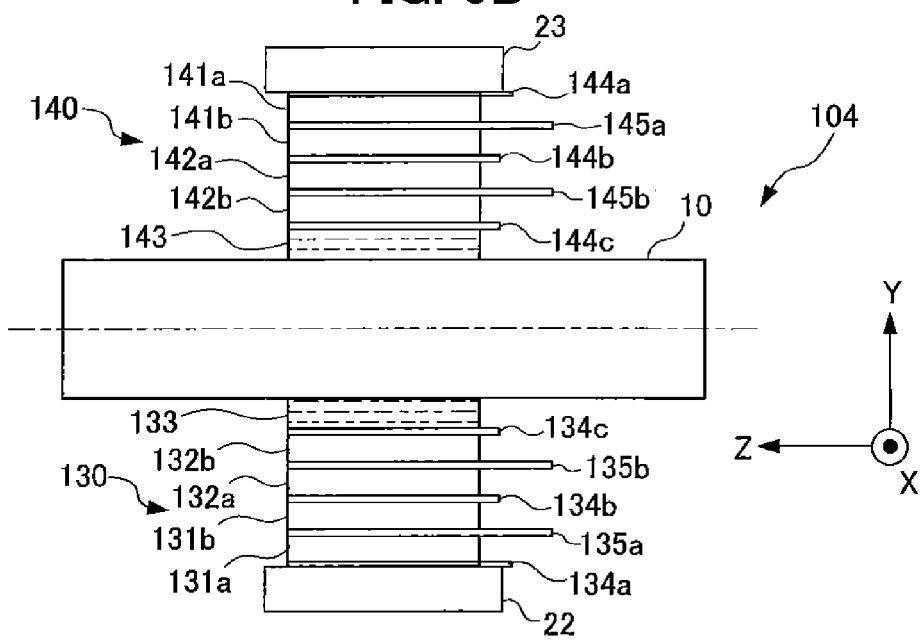
Figure 6A:
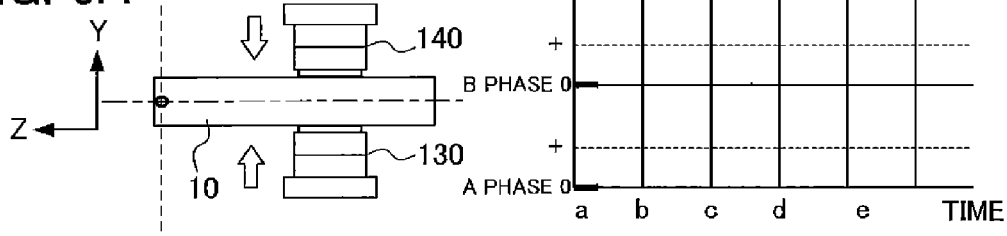
FIGS. 6A, 6B, 6C, 6D and 6E show diagrams illustrating an operation of the piezoelectric actuator shown in FIGS. 5A and 5B.
Figure 6B:
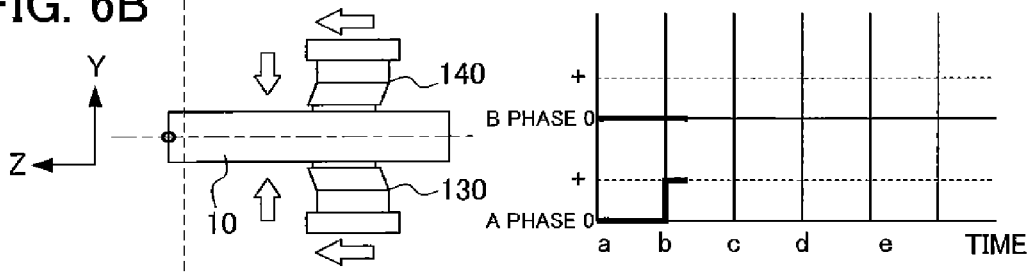
Figure 6C:
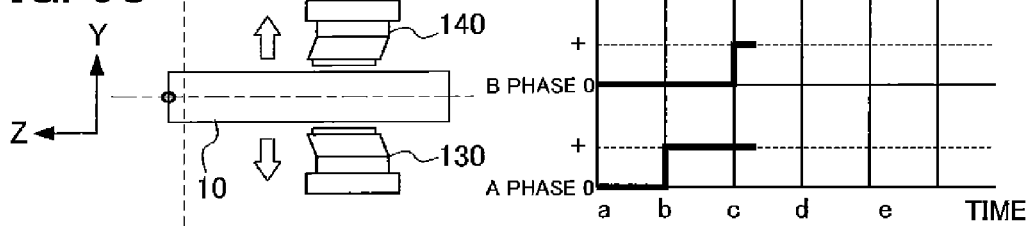
Figure 6D:
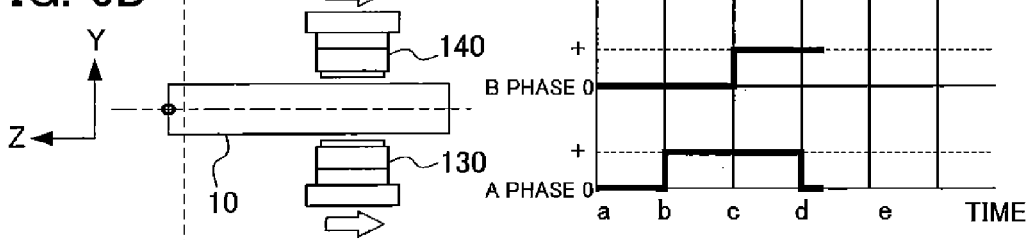
Figure 6E:
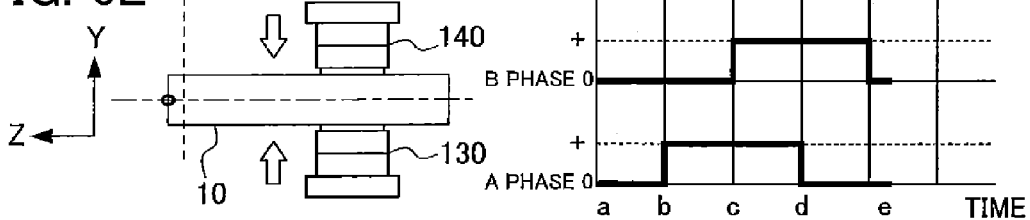

FIGS. 5A and 5B show a diagram illustrating a piezoelectric actuator according to the second embodiment.

In FIG. 5A shows a cross-sectional view of the piezoelectric actuator from Z axis direction (optical axis direction), and FIG. 5B shows a cross-sectional view of the piezoelectric actuator from X axis direction (direction intersecting perpendicularly with the optical axis A).

The piezoelectric actuator 104 according to the second embodiment differs from the piezoelectric actuator 4 according to the first embodiment in an arrangement of the piezoelectric element. Hereafter, an arrangement of the piezoelectric element of the piezoelectric actuator 104 according to the second embodiment will be described.

The piezoelectric actuator 104 is provided with a first actuator 130 fixed to a fixing portion 22 of a supporting portion 21, and a second actuator 140 fixed to an adjusting portion 23 of the supporting portion 21. The output member 10 runs through between the first actuator 130 and the second actuator 140.

As shown in FIG. 5B, the first actuator 130 is provided with a set of pressurizing piezoelectric elements 131a and 131b, and a set of driving piezoelectric elements 132a and 132b. The first pressurizing piezoelectric element 131a is installed to the fixing portion 22, and the other pressurizing piezoelectric element 131b is laminated above the first pressurizing piezoelectric element 131a.

Moreover, the first driving piezoelectric element 132a is laminated above the other pressurizing piezoelectric element 131b, and the other driving piezoelectric element 132b is laminated above the first driving piezoelectric element 132a. Furthermore, the friction member 133 is laminated above the other driving piezoelectric element 132b.

The electrode plates 135a and 135b, which are driving electrodes, are arranged between the set of pressurizing piezoelectric elements 131a and 131b, and between the set of driving piezoelectric elements 132a and 132b, respectively. Moreover, electrode plates 134a, 134b, and 134c, which are GND electrodes, are arranged between the first driving piezoelectric element 132a and the fixing portions 22, between the other pressurizing piezoelectric element 131b and the first driving piezoelectric element 132a, and between the other driving piezoelectric element 132b and the friction member 133, respectively.

The set of pressurizing piezoelectric elements 131a and 131b are similar to that of the set of piezoelectric elements 31 and 32 included in the pressurizing actuator 30 according to the first embodiment, and are displaced in their thickness direction (Y axis direction) by the B phase driving signal being inputted into the electrode plate 135a.

The set of driving piezoelectric elements 132a and 132b are similar to that of the driving actuator 40 according to the first embodiment, and are displaced in a direction (Z axis direction) intersecting perpendicularly with their thickness direction by the A phase driving signal being inputted into the electrode plate 135b.

The second actuator 140 is substantially the same with the first actuator 130 with the exception of its arrangement, and therefore, its description is omitted. A friction member 143 is provided at this second actuator 140 as in the first actuator 130, and the output member 10 is in contact with each of a set of friction members 133 and 143.

Next, an operation of the piezoelectric actuator 104 will be described.

FIG. 6 shows a diagram illustrating an operation of the piezoelectric actuator shown in FIG. 5.

<State (a): Initial State>

This is a state where the A phase driving signal is at a low level voltage value L (0V) and the B phase driving signal is at a low level voltage value L (0V).

In this state (a), the pressurizing piezoelectric elements 131a and 131b included in the first actuator 130, and the pressurizing piezoelectric elements 141a and 141b included in the second actuator 140 are respectively pressing the output member 10 toward each other. At the piezoelectric actuator 104, the state shown in FIG. 6A continues from time a until time b.

<State (b): Driving Piezoelectric Element Displacement>

This is a state where the A phase driving signal is at a high level voltage value H (predetermined positive voltage value) and the B phase driving signal is at a low level voltage value L (0V)

When the A phase driving signal is inputted at a state where the pressurizing piezoelectric elements 131a, 131b, and 141a, 141b are pressing the output member 10 towards the other, the driving piezoelectric elements 132a and 132b included in the first actuator 130, and the driving piezoelectric elements 142a and 142b included in the second actuator 140 are respectively displaced in +Z direction. Accordingly, the output member 10 moves in the optical axis direction. At the piezoelectric actuator 104, the state shown in FIG. 6B continues from time b until time c.

<State (c): Pressurizing Piezoelectric Element Displacement>

This is a state where the A phase driving signal is at a high level voltage value H (predetermined positive voltage value) and the B phase driving signal is at a high level voltage value H (predetermined positive voltage value).

When the B phase driving signal is inputted in a state where the driving piezoelectric elements 132a, 132b, 142a, and 142b respectively remain at the displaced position, accordingly, the pressurizing piezoelectric elements 131a, 131b, 141a, and 141b is respectively displaced in directions that make the size in Y axis direction smaller. Then, according to the displacement of these piezoelectric elements, the friction members 133 and 143 respectively move apart from the output member 10. The time after the friction members 133 and 143 move apart from the output member 10 until contacting it again is very short, and therefore, it is possible to ignore practically the possibility that the posture of the output member 10 becomes unstable because of its own weight or other reasons. At the piezoelectric actuator 104, the state shown in FIG. 6C continues from time c until time d.

<State (d): Driving Piezoelectric Element Restitution>

This is a state where the A phase driving signal is at a low level voltage value L (0V) and the B phase driving signal is at a high level voltage value H (predetermined positive voltage value).

If the A phase driving signal is removed at a state where the pressurization toward the output member 10 is removed, the pressurizing piezoelectric elements 131a, 131b, 141a, and 141b respectively return to the position at the initial state of state (a). At this time, the friction members 133 and 143 and the output member 10 are respectively at a non-contacting state, and therefore, the output member 10 does not move in Z axis direction. At the piezoelectric actuator 104, the state shown in FIG. 6D continues from time d until time e.

<State (e): Initial State>

This is a state where the A phase driving signal is at a low level voltage value L (0V) and the B phase driving signal is at a low level voltage value L (0V), as in state (a).

With regards to the piezoelectric actuator 104 according to the second embodiment, the two actuators 130 and 140 collaborate with each other to drive the output member 10, and therefore, it is possible to obtain high output. Accordingly, it is possible to obtain the same output as the first embodiment by a smaller piezoelectric element, and it is possible to miniaturize the overall size of the piezoelectric actuator 104.

Moreover, in the piezoelectric actuator 4 according to the first embodiment, the driving actuator 40 drives the output member 10 against frictional force between the slide member 33 included in the pressurizing actuator 30, and the output member 10. Meanwhile, the piezoelectric actuator 104 according to the second embodiment is efficient since the displacement of the driving piezoelectric elements 132a, 132b, 142a, and 142b is transmitted to the output member 10 lossless.

Third Embodiment

Next, a third embodiment of the piezoelectric actuator in accordance with the present invention will be described.

Figure 7:
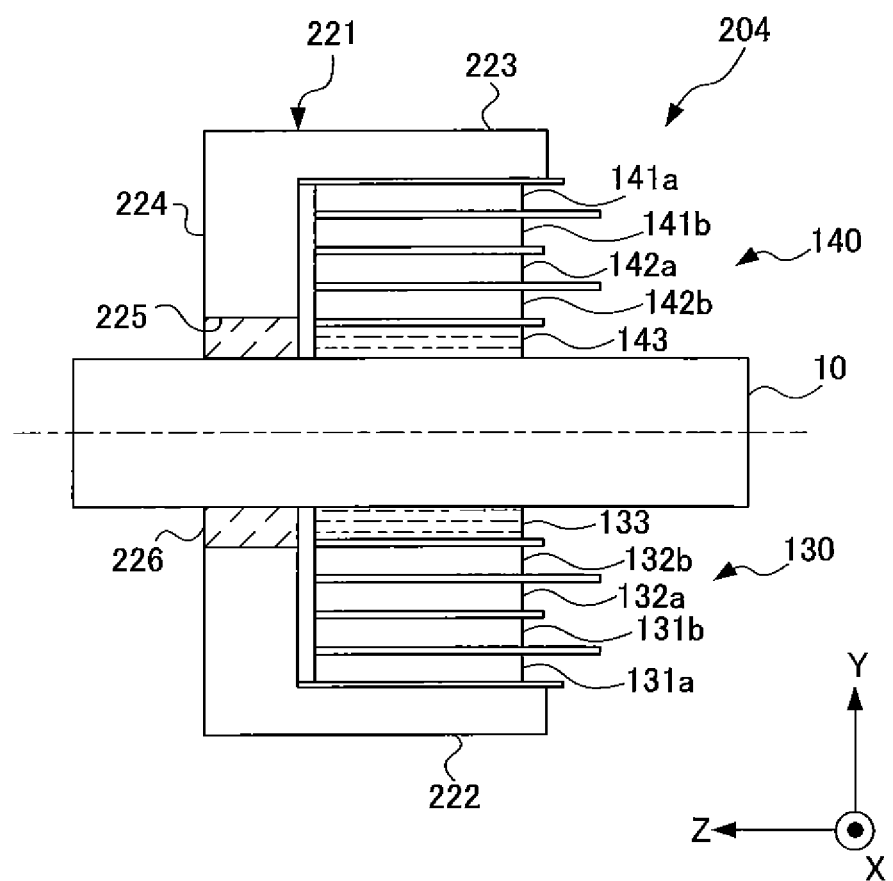
FIG. 7 shows a diagram illustrating a piezoelectric actuator according to a third embodiment.

FIG. 7 shows a diagram illustrating the piezoelectric actuator according to the third embodiment.

The piezoelectric actuator 204 according to the third embodiment drives the output member 10 with the first actuator 130 and the second actuator 140 as in the second embodiment, but is different in that the supporting portion 221 supports the output member 10 in addition to the first actuator 130 and second actuator 140.

The supporting portion 221 is provided with a first supporting portion 222 which supports the first actuator 130, a second supporting portion 223 which supports the second actuator 140, and a third supporting portion 224 which supports the output member 10.

The third supporting portion 224 is a plate-like portion substantially intersecting perpendicularly to Z axis (substantially intersecting perpendicularly to optical axis A), and is fixed to the fixed tube 1 (refer to FIG. 5A).

A through hole 225 having vertical direction size and horizontal direction size larger than vertical direction size and horizontal direction size of the output member 10 is formed in the center portion of the third supporting portion 224. Further, the friction member 226 in contact with the exterior surface of the output member 10 is fixed to the interior surface side of the through hole 225. The shape of the friction member 226 is not limited in particular. As shown in FIG. 7, it may be in contact with only upper and lower surface portions of the output member 10, and may be in contact with all of the upper, lower, left and right surface portions of the output member 10.

Here, even if the first actuator 130 and second actuator 140 are respectively in the state (refer to state (c) and (d) in FIG. 6) moved apart from the output member 10, the coefficient of friction between the output member 10 and the friction member 226 are set to produce frictional force having sufficient magnitude to suppress the motion in Z axis direction caused by the weight of the output member 10.

However, the coefficient of friction between the friction member 226 and the output member 10 is set so that the frictional force produced between the friction member 226 and the output member 10 is smaller than the frictional force produced between the friction members 133 and 143 and the output member 10 included in the first actuator 130 and the second actuator 140 upon driving the output member 10 in the optical axis direction (refer to state (b) in FIG. 6).

The operation of the piezoelectric actuator 204 according to the third embodiment is substantially the same with that of the piezoelectric actuator 104 according to the second embodiment, and therefore, the description is omitted.

Even when the friction members 133 and 143 included in the first actuator 130 and second actuator 140 are moving away from the output member (refer to state (c) and (d) in FIG. 6), the output member 10 is supported by the friction member 226 at all times, and therefore, the piezoelectric actuator 204 according to the third embodiment can drive the output member more stably.

Fourth Embodiment

Next, the fourth embodiment of the piezoelectric actuator in accordance with the present invention will be described.

Figure 8:
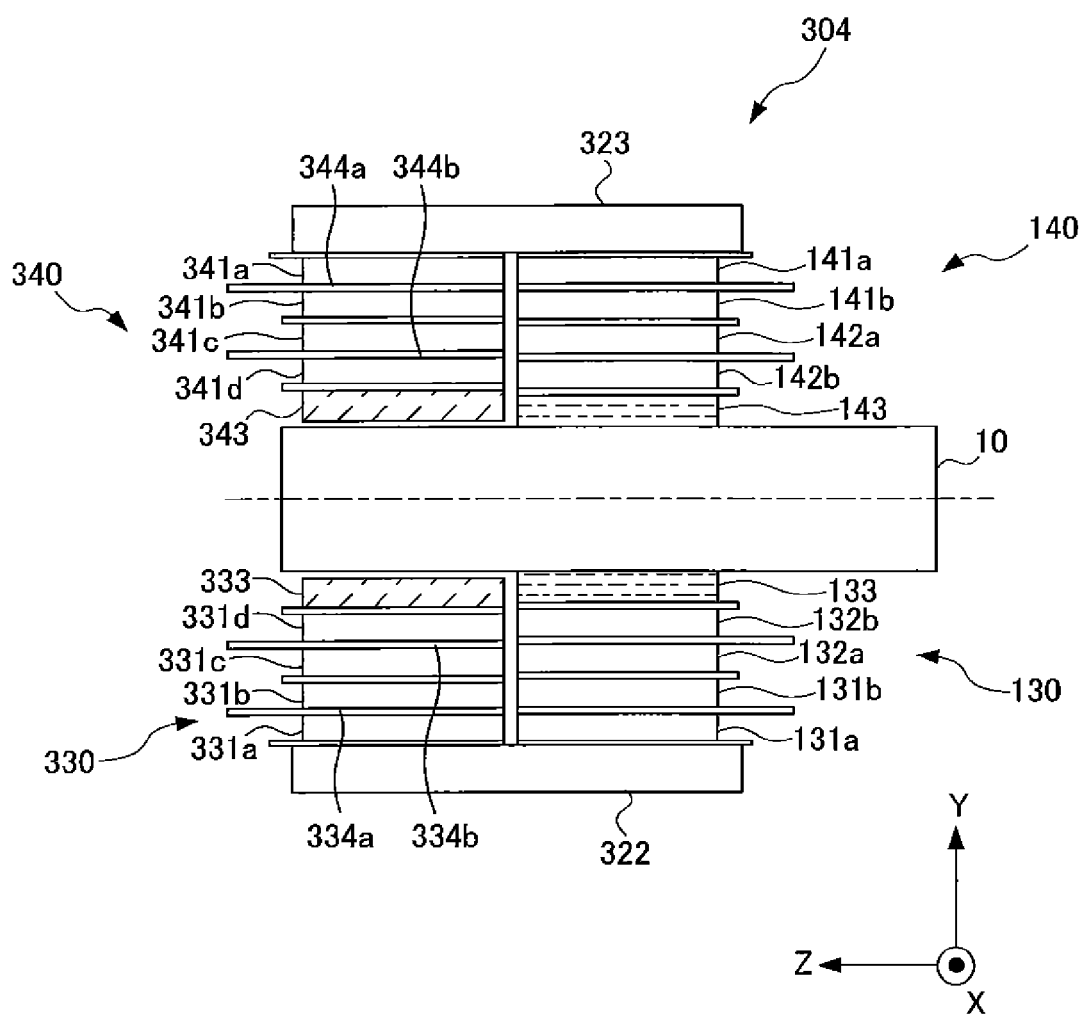
FIG. 8 shows a diagram illustrating a piezoelectric actuator according to a fourth embodiment.
Figure 9A:
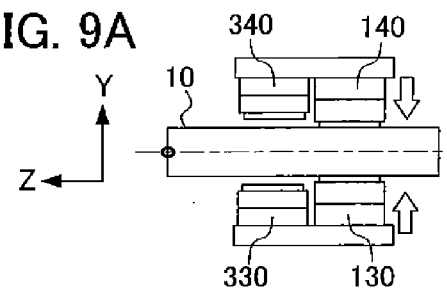
FIGS. 9A, 9B, 9C, 9D and 9E show diagrams illustrating an operation of the piezoelectric actuator shown in FIG. 8.
Figure 9A:
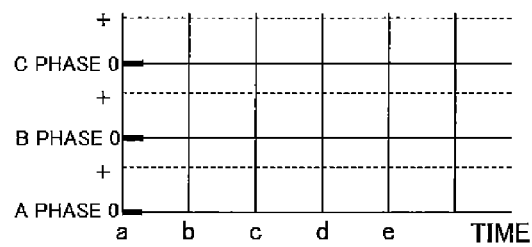
Figure 9B:
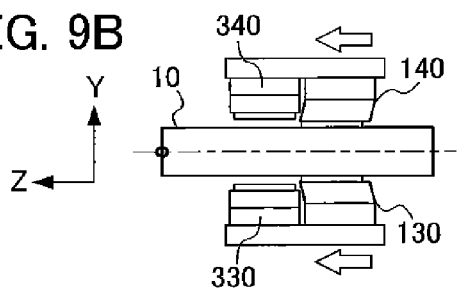
Figure 9B:
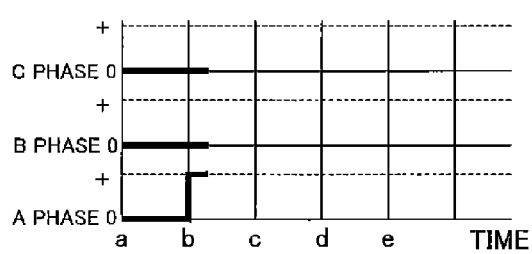
Figure 9C:
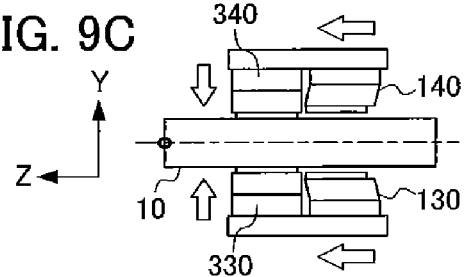
Figure 9C:
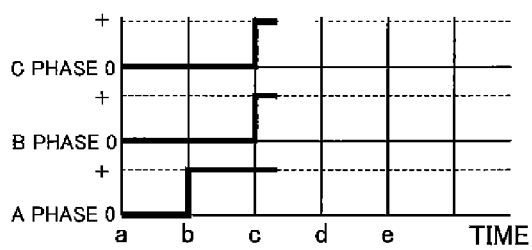
Figure 9D:
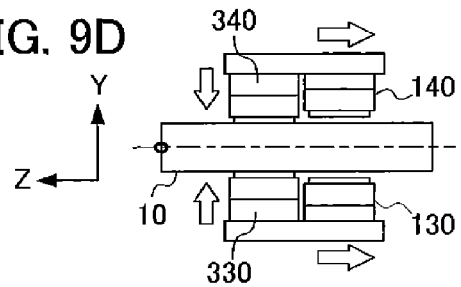
Figure 9D:
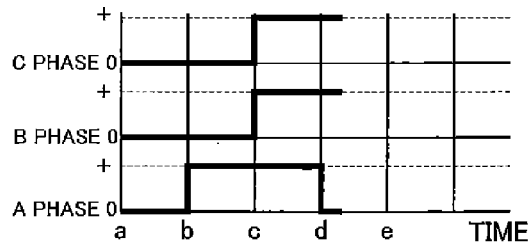
Figure 9E:
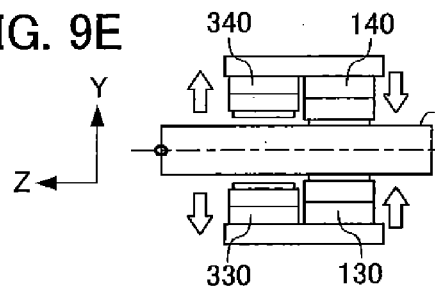
Figure 9E:
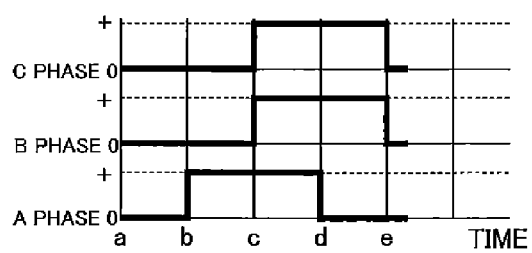

FIG. 8 shows a diagram illustrating a piezoelectric actuator according to the fourth embodiment.

The piezoelectric actuator 304 according to the fourth embodiment is driven with the first actuator 130 and the second actuator 140 that drive the output member 10, as in the second embodiment. Moreover, the piezoelectric actuator 304 is provided with a third actuator 330 and a fourth actuator 340 that are arranged so that the output member 10 locates between them.

The third actuator 330 is supported by the supporting portion 322 in a state adjoining in the optical axis direction with respect to the first actuator 130. The fourth actuator 340 is supported by the supporting portion 323 in a state adjoining in the optical axis direction with respect to the second actuator 140.

As to the third actuator 330, one set of pressurizing piezoelectric elements, i.e., two pressurizing piezoelectric elements, having similar arrangement with the pressurizing piezoelectric elements 131a and 131b included in the first actuator 130 are formed laminating in Y axis direction, and there is provided with total of four pressurizing piezoelectric elements 331 a-d. Electrode plates 334a and 334b, which are respectively driving electrodes, are located between the pressurizing piezoelectric element 331a and the pressurizing piezoelectric element 331b and between the pressurizing piezoelectric element 331c and the pressurizing piezoelectric element 331d, and when a C phase driving signal is inputted into the electrode plates 344a and 344b, the third actuator 330 is displaced in the direction that makes its size in Y axis direction longer.

The arrangement of the fourth actuator 340 is substantially the same with the third actuator 330.

The third actuator 330 and the fourth actuator 340 are respectively provided with friction members 333 and 343 laminated above the four pressurizing piezoelectric elements.

The coefficient of friction between the friction members 333 and 343 and the output member 10 is set so that even if the first actuator 130 and second actuator 140 are respectively in a state (refer to state (c) and (d) in FIG. 9) moved apart from the output member 10, the frictional force enough to suppress the move into Z axis direction caused by the own weight of the output member 10 is produced.

FIG. 9 shows a diagram illustrating an operation of the piezoelectric actuator shown in FIG. 8.

<State (a): Initial State>

This is an initial state where all of the A phase driving signal, the B phase driving signal, and the C phase driving signal are at a low level voltage value L (0V).

In this initial state, the first actuator 130 and second actuator 140 are pressurizing the output member 10 toward each other. Meanwhile, the third actuator 330 and fourth actuator 340 have their friction members 333 and 334, respectively, moved apart from the output member 10. At the piezoelectric actuator 304, the state shown in FIG. 9A continues from time a until time b.

<State (b): Driving Actuator Displacement>

This is a state where the A phase driving signal is at a high level voltage value H (predetermined positive voltage value), and the B phase driving signal and the C phase driving signal are at the low level voltage value L (0V).

The driving signal is inputted into A phase, and the first actuator 130 and second actuator 140 are respectively displaced in Z axis direction, and the output member 10 is driven in the optical axis direction in accordance with the displacement. At the piezoelectric actuator 304, the state shown in FIG. 9B continues from time b until time c.

<State (c): Pressurizing Actuator Switching>

This is a state where all of A phase driving signal, B phase driving signal, and C phase driving signal are at the high voltage value H (predetermined positive voltage value).

In addition to A phase, the driving signal is inputted into B phase and C phase, respectively. The first actuator 130 and second actuator 140 are respectively displaced in the direction that makes their size in Y axis direction short, with the displacement in Z axis direction maintained, and the friction members 133 and 134 respectively move apart from the output member 10. Substantially simultaneously with this, the third actuator 330 and fourth actuator 340 are displaced in the direction that makes their size in Y axis direction longer, and substantially fix the output member 10 to the fixed tube 1 by pressurizing the output member 10 toward each other. At the piezoelectric actuator 304, the state shown in FIG. 9 (c) continues from time c until time d.

<State (d): Driving Actuator Restitution>

This is a state where the A phase driving signal is at a low level voltage value L (0V), and the B phase driving signal and the C phase driving signal are at the high level voltage value H (predetermined positive voltage value).

The driving signal for A phase is removed at a state where the third actuator 330 and the fourth actuator 340 keep hold of the output member 10, and the first actuator 130 and the second actuator 140 respectively return to the same state as the initial state of (a). At the piezoelectric actuator 304, the state shown in FIG. 9D continues from time d until time e.

<State (e): Initial State>

This is a state where all of A phase driving signal, B phase driving signal, and C phase driving signal are at the low level voltage value L (0V).

The driving signal for B phase and C phase is removed, and accordingly, the third actuator 330 and the fourth actuator 340 remove the hold of the output member 10. Substantially simultaneously with this, the first actuator 130 and second actuator 140 are displaced in the direction that makes their size in Y axis direction longer, and hold the output member 10.

In accordance with the piezoelectric actuator 304 of the above-described fourth embodiment, in addition to the same advantageous effects with the second embodiment, the output member 10 is always held, and therefore, it is possible to drive the output member 10 stably as in the piezoelectric actuator 204 of the third embodiment.

Moreover, in contrast with the piezoelectric actuator 204 according to the third embodiment, which drives the output member 10 against the frictional force between the friction member 226 and the output member 10, the piezoelectric actuator 304 according to the fourth embodiment achieves high efficiency since the displacement of the driving piezoelectric elements 132a, 132b, 142a, and 142b are transmitted lossless to the output member 10.

[Modified Form]

The present invention is not limited to the above-described embodiments. Various modifications and changes, such as the following, may be done, and these are also included in the technical scope of the present invention.

(1) The piezoelectric actuator of the above embodiments drives the focus lens included in the lens barrel with respect to the fixed tube. However, the object to be driven by the piezoelectric actuator is not limited to this. For example, other optical systems, such as zoom lenses, may be driven. Moreover, the driving direction for the object to be driven is not limited to the direction parallel to the optical axis, and may be a direction intersecting with the optical axis, for example. For example, the piezoelectric actuator may be used to drive a vibration reduction lens at a plane perpendicular with the optical axis. Furthermore, the object to be driven by the piezoelectric actuator is not limited to a lens. Moreover, in the above embodiments, the piezoelectric actuator is provided in the lens barrel. However, the location where the piezoelectric actuator is provided is not limited to such kind of optical device and it may be provided in various electronic devices, such as an X-Y stage and a printer device.

(2) The piezoelectric actuator of the above embodiments has an arrangement where the driving portion fixed to the fixed tube drives the output member with respect to the fixed tube. However, the piezoelectric actuator is not limited to this arrangement and the output member may be fixed so that the driving portion moves with respect to the fixed member.

(3) In the first embodiment, the slide member included in the pressurizing actuator is moved apart from the output member in a non-pressurized state. However, the slide member is not limited to such an arrangement and may be in contact with the slide member as long as the output member is not pressed toward the friction member upon the driving actuator is displaced in a direction opposite to the time when it is driving.

(4) The piezoelectric actuator according to the first embodiment has pressurizing and driving actuators that are placed so that the upper surface portion and the lower surface portion of the output member are in between them. However, in addition to such actuators, pressurizing and driving actuators that are placed so that the left surface portion and right surface portion are in between them.

(5) As to the output member of the above embodiments, the cross section intersecting perpendicularly to the driving direction is rectangle-shaped but it is not limited to such a shape and may be a round shape, or a polygon other than a quadrangle.

(6) In the above embodiments, the driving actuator and the pressurizing actuator have substantially the same position along the optical axis direction. However, they are not limited to such an arrangement and the driving actuator and the pressurizing actuator may have different positions along the optical axis direction.

(7) In each of the above embodiments, the pressurizing piezoelectric element and the driving piezoelectric element are constructed with one set of piezoelectric actuators each having an opposite polarization direction. However, they are not limited to such an arrangement and may be constructed with one piezoelectric element, or three or more piezoelectric elements.

The invention claimed is:

1. An piezoelectric actuator comprising:
   a first actuator including a first piezoelectric element to be displaced in a first direction;
   a second actuator, which includes a second piezoelectric element to be displaced in a second direction intersecting with the first direction, and is arranged in a direction intersecting with the first direction with respect to the first actuator; and a relative motion member, which is arranged between the first actuator and the second actuator and can be relatively moved in the first direction with respect to the first actuator; and wherein the relative motion member is in contact with a friction member provided in the first actuator and with a slide member provided in the second actuator, the second actuator can be switched to a pressurized state where the first actuator is pressed against the relative motion member by displacement of the second piezoelectric element, and a non-pressurized state where the pressurization is removed, and the relative motion member is relatively moved in the first direction by displacement of the first piezoelectric element during the pressurized state.

2. The piezoelectric actuator according to claim 1, wherein the second actuator is set to the non-pressurized state after the displacement of the first piezoelectric element, and when the second actuator is in the non-pressurized state, the first piezoelectric element is displaced in a direction opposite to the direction moved by the first piezoelectric element during the relative motion by the relative motion member.

3. The piezoelectric actuator according to claim 1, wherein the first actuator includes a first contact portion, which is in contact with the relative motion member when in the pressurized state, and is moved in the first direction in conjunction with the displacement of the first piezoelectric element, and the relative motion member performs the relative motion by a frictional force produced between the first contact portion.

4. The piezoelectric actuator according to claim 3, wherein the second actuator includes a second contact portion, which is in contact with the relative motion member when in both the pressurized state and the non-pressurized state, and frictional force produced between the first contact portion and the relative motion member is larger than frictional force produced between the second contact portion and the relative motion member when in the pressurized state, and is smaller than frictional force produced between the second contact portion and the relative motion member when in the non-pressurized state.

5. The piezoelectric actuator according to claim 1, further comprising a through hole defining portion for defining a through hole that penetrates in the first direction, wherein the relative motion member is arranged to pass through the through hole, and a friction member for suppressing the relative motion of the relative motion member caused by its own weight by means of a frictional force produced when the relative motion member is arranged in the through hole defining portion.

6. The piezoelectric actuator according to claim 1, further comprising a retention mechanism for holding the relative motion member when the second actuator is in the non-pressurized state, and suppressing the relative motion of the relative motion member caused by its own weight by means of a frictional force produced between the retention mechanism and the relative motion member.

7. A lens barrel comprising:
the piezoelectric actuator according to claim 1; and
a lens included in the piezoelectric actuator and moves in conjunction with the relative motion member.

8. An optical device comprising the piezoelectric actuator according to claim 1.

9. The piezoelectric actuator according to claim 1, wherein a coefficient of friction between the friction member and the relative motion member is greater than a coefficient of friction between the slide member and the relative motion member.

10. A piezoelectric actuator comprising:
a first actuator including a first piezoelectric element to be displaced in a first direction and a third piezoelectric element to be displaced in a second direction intersecting with the first direction, the first piezoelectric element and the third piezoelectric element being layered, a second actuator including a second piezoelectric element to be displaced in the second direction and a fourth piezoelectric element to be displaced in the first direction, the second piezoelectric element and the fourth piezoelectric element being layered, and a relative motion member that is relatively moved in the first direction between the first actuator and the second actuator, wherein:

a friction member is provided in the first actuator and in the second actuator, a first face of the friction member being in contact with the relative motion member and a second face of the friction member being in contact with the third piezoelectric element or the second piezoelectric element;

a first direct current voltage is applied simultaneously to the first piezoelectric element of the first actuator and to the fourth piezoelectric element of the second actuator to trigger displacement in the first direction; and a second direct current voltage is applied simultaneously to the third piezoelectric element of the first actuator and to the second piezoelectric element of the second actuator to trigger displacement in the second direction.

11. The piezoelectric actuator according to claim 10, wherein both the first actuator and the second actuator are set into the non-pressurized state after the displacement of the first piezoelectric element, and when both the first actuator and the second actuator are in the non-pressurized state, the first piezoelectric element and the fourth piezoelectric element are displaced in a direction opposite to the direction moved by the first piezoelectric element and the fourth piezoelectric element during the relative motion by the relative motion member.

12. The piezoelectric actuator according to claim 10, wherein the first piezoelectric element and the third piezoelectric element, as well as the second piezoelectric element and the fourth piezoelectric element are respectively laminated in the second direction.

* * * * *